(12) United States Patent
Bayerer

(10) Patent No.: US 8,148,845 B2
(45) Date of Patent: Apr. 3, 2012

(54) CIRCUIT ASSEMBLY INCLUDING A POWER SEMICONDUCTOR MODULE AND A CONTROLLER

(75) Inventor: Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 219 days.

(21) Appl. No.: 12/570,633

(22) Filed: Sep. 30, 2009

(65) Prior Publication Data

US 2010/0084926 A1 Apr. 8, 2010

(30) Foreign Application Priority Data

Sep. 30, 2008 (DE) .......................... 10 2008 049 673

(51) Int. Cl.
*H05K 1/00* (2006.01)
(52) U.S. Cl. ........................................................ 307/42
(58) Field of Classification Search .................. 307/42
See application file for complete search history.

(56) References Cited

U.S. PATENT DOCUMENTS

| | | | |
|---|---|---|---|
| 4,511,815 A | 4/1985 | Wood | |
| 5,455,758 A | 10/1995 | Pelly | |
| 6,686,831 B2 * | 2/2004 | Cook et al. ..................... | 323/273 |
| 2003/0058597 A1 * | 3/2003 | Bruckmann et al. .......... | 361/100 |
| 2007/0216377 A1 | 9/2007 | Yoshimura | |
| 2009/0002115 A1 * | 1/2009 | Brennan et al. ............... | 336/200 |
| 2010/0069000 A1 * | 3/2010 | Nakagawa .................... | 455/41.1 |
| 2011/0028103 A1 * | 2/2011 | Rofougaran ................... | 455/77 |

FOREIGN PATENT DOCUMENTS

| | | |
|---|---|---|
| DE | 3124891 | 1/1983 |
| DE | 4441492 | 5/1996 |
| DE | 19963330 | 9/2000 |
| DE | 19910327 | 11/2001 |
| DE | 10202480 | 8/2002 |
| DE | 10147472 | 4/2003 |
| DE | 10027088 | 5/2003 |
| DE | 102005036116 | 2/2007 |
| EP | 0099801 | 2/1984 |
| EP | 0751570 | 1/1997 |
| EP | 0784376 | 7/1997 |
| EP | 1143619 | 7/2005 |

OTHER PUBLICATIONS

Xiaoling, Yu et al., "Study of Thermal Effect of Power Circuit on Driver & Protection PCB in Hybrid IPEM," Jml of Micro and Elect Pckg, vol. 1, No. 2, 2nd Qtr, pp. 95-101 (2004).
Scharf, Achim, "Towards Intelligent Modules," Power Electronics, PCIM Europe, pp. 293-297 (Sep./Oct. 1990).
Bayerer, Reinhold, "Higher Junction Temperature in Power Modules—a Demand from Hybrid Cars, a Potential for the Next Step Increase in Power Density for Various Variable Speed Drives," PCIM, pp. 7 (2008).

(Continued)

*Primary Examiner* — Robert L. Deberadinis
(74) *Attorney, Agent, or Firm* — Dicke, Billig & Czaja, PLLC

(57) ABSTRACT

A circuit assembly includes a power semiconductor module and, arranged externally thereto, a controller wherein the power semiconductor module comprises at least one controllable power semiconductor as well as at least one driver gating the latter, and controller and power semiconductor module each comprising a transceiver configured to communicate control signals between the controller and the power semiconductor module via an electromagnetic communication link unidirectionally or bidirectionally.

22 Claims, 7 Drawing Sheets

OTHER PUBLICATIONS

Strzalkowski, Bernhard, "Neue Möglichkeiten der Systemintegration in der Leistungselektro-nik mittels planarer integrierter Mikrotransformatoren" (Novel Approaches of System Integration in Power Electronics Using Planar Integrated Microtransformers), Infineon Technologies AG, ETG Symposium, pp. 6, (Oct. 10-11, 2006).

* cited by examiner

CIRCUIT ASSEMBLY INCLUDING A POWER SEMICONDUCTOR MODULE AND A CONTROLLER

CROSS-REFERENCE TO RELATED APPLICATIONS

This Utility Patent Application claims priority to German Patent Application No. DE 10 2008 049 673.1-31, filed on Sep. 30, 2008, and incorporated herein by reference.

BACKGROUND

One aspect relates to a device including power semiconductor components, corresponding drivers, and at least one corresponding controller.

Controllable power semiconductor components (that will be referred to as power semiconductors in the following) are often embedded singly or multiply in power semiconductor modules that are encapsulated in plastic for protection against dirt, mechanical stress and other environmental effects. Such power semiconductor modules are often employed as fast electronic switches for handling high currents and/or voltages, as is the case, for example, with frequency converters which generate from an AC line voltage of constant voltage and constant frequency AC voltages of optional level and frequency for corresponding consumers such as, for instance, asynchronous motors or synchronous motors.

These power semiconductors are thereby driven by at least one controller or regulator in conjunction with corresponding drivers for the individual power semiconductors or arrays thereof. The purpose of such drivers is to convert the signals output by the controller and usually of low power or unsuitable voltage into the wanted signals for driving the power semiconductors. It is often the case that the drivers also handle other functions, they thus also detect temperature, current and voltage at the power semiconductors and signal these back to the controller for decoding so that the power semiconductors can be instantly turned off when an undesired operating state occurs. Since voltages, levels and currents used by the controller greatly differ from the voltages, potentials and currents to be switched, it is expedient to at least separate the potentials concerned from each other. If, in addition to this, not only signal communication in one direction (unidirectional) namely in communicating the control signals from the controller to the drivers, but also return signalling is needed as described above, communicating the signals in both directions (bidirectional) needs to be possible.

As is usually the case with intelligent power modules (IPM) the power semiconductors, further integrated electronic circuitry for the drivers and protection functions as well as optocouplers for transmitting the control signals on a printed circuit board or in a substrate, respectively, are grouped together into a module, for example. The voltage for powering the electronic circuitry has to be made available externally. In this connection thermal problems may occur, since power semiconductors dissipate a substantial amount of heat. Although the power semiconductors themselves can withstand even relatively high temperatures (future requirements calling for up to 200° C. and higher) the other circuit components cooperating therewith, especially the controller electronics, have problems handling temperatures exceeding 100° C. This is why known modules are often operated at lower maximum temperatures and thus at lower continuous power than as actually available by the power semiconductors, and/or why complicated measures need to be taken to improve cooling.

Power semiconductors and circuitry directly involved therein, such as drivers whose floating power supply and elements for signal communication from the controller to the drivers, are engineered, where possible, in similar or same technology. Additionally such circuitry may be designed to be directly mounted on the same substrate as that of the power semiconductors. The resulting module is superior to function-comparable commercially available modules as to footprint and high temperature performance. Unfortunately, however, a considerable heat flow is transmitted to the control electronics via the electrically conductive connections between the control electronics and drivers. Apart from this, the control electronics is structured too complex to achieve a comparable high temperature performance at reasonable expense. On the other hand to avoid overheating the control electronics the power semiconductors cannot be operated to their full or maximum temperature handling capacity.

There is therefore a need for using durably operating the power semiconductors of a power semiconductor module to their limits.

For these and other reasons there is a need for the present invention.

SUMMARY

A first embodiment relates to a circuit assembly including: a power semiconductor module; and a controller arranged externally to the power semiconductor module. The power semiconductor module includes at least one controllable power semiconductor and at least one driver controlling the at least one power semiconductor. The controller and the power semiconductor module each include a transceiver configured to communicate control signals between the controller and the at least one power semiconductor module via an electromagnetic communication link unidirectionally or bidirectionally.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF THE DRAWINGS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The term "driver" is used in the following for the part of the circuit arranged between a potential barrier and a power semiconductor. The term "controller" is used for the part of the circuit located at the side of the potential barrier that is opposite to the side of the power semiconductor.

Figure 1:
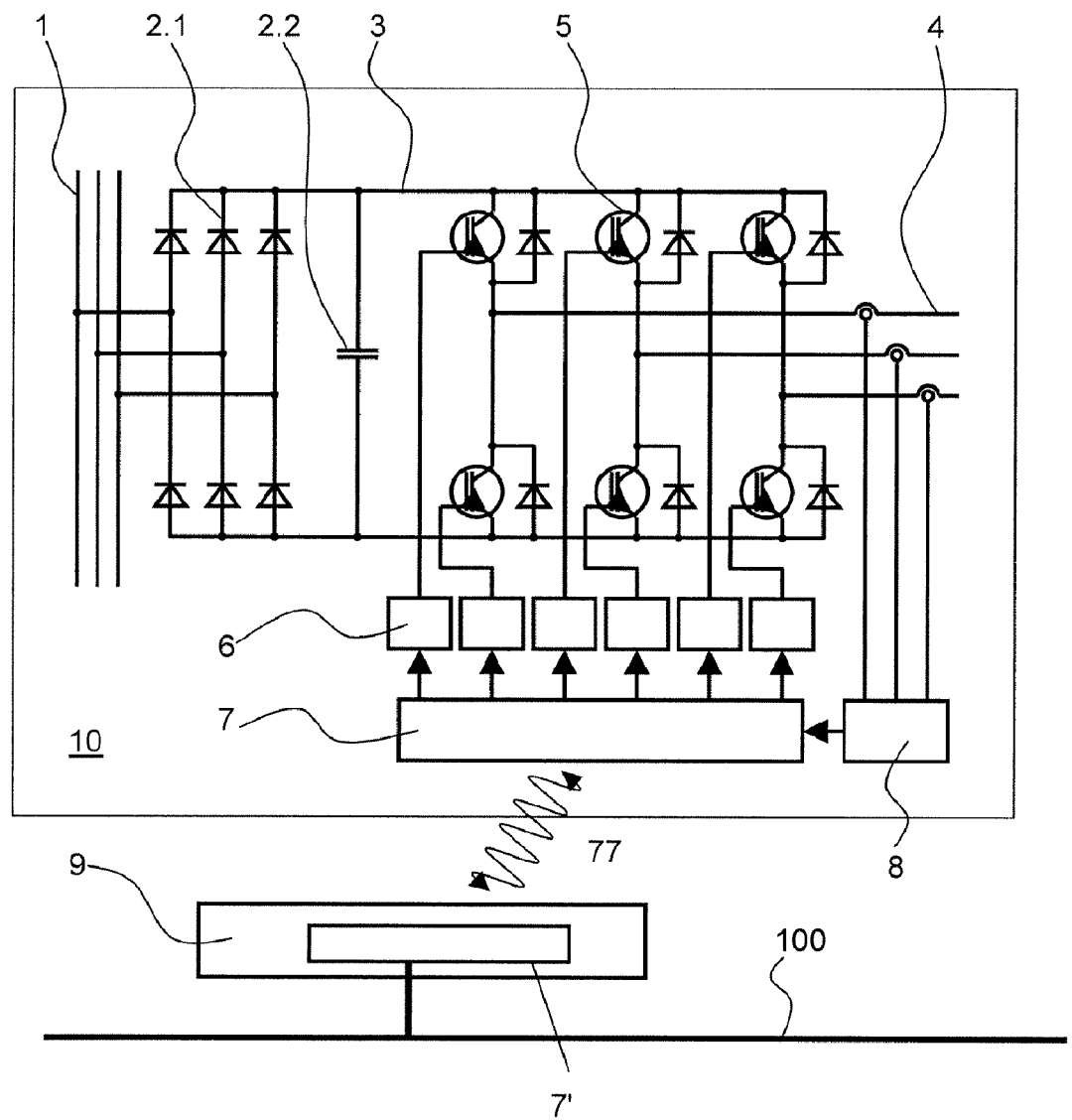
FIG. 1 is a block circuit diagram of an example of a power electronics device as presented herein.

Referring now to FIG. 1 there is illustrated, by way of example, a converter circuit in which a DC link 3 having a DC link capacitor 2.2 is supplied from a three-phase AC line voltage supply 1 having a constant AC voltage and a constant frequency via a rectifier bridge 2.1. An inverter bridge of six power semiconductors 5 arranged in three half-bridges, each including two power semiconductors, generates a three-phase power supply 4 for a consumer (not shown) from the voltage provided by the DC link 3. The output voltage pulses are controlled, for example, so that when averaged in time a three-phase voltage is generated, the rms (root mean square value) and frequency of which are optionally variable.

Applied to the control terminals of the individual power semiconductors 5 is the output voltage of each driver 6 dictating whether the corresponding power semiconductor is switched on (is ON) or switched off (is OFF). For this purpose the drivers 6 are controlled by a transceiver module 7 connected to a floating signal communication link 77.

The transceiver module 7 that is structured less complex and temperature-resistant in a power semiconductor module 10, for example, generates from commands it receives from a controller 9 control signals for the driver 6. However, it is just as possible that instead of just a single transceiver module 7 six such transceiver modules 7 could be used for six separate channels, each capable of switching each of the power semiconductors 5. In addition, with the aid of a detector 8 detecting the electrical output variables the transceiver module 7 monitors other parameters of the power semiconductor module 10. Detector 8 and transceiver module 7 form together the central communication interface with the controller 9, controller 9 for this purpose, for example, includes a corresponding transceiver 7'. Detector 8, controller 9, driver 6 and the power semiconductors 5 are combined into a compact submodule in the power semiconductor module 10 and all of which are mounted on a common substrate, for instance.

Power semiconductor module 10 may include a plastic housing (only schematically shown in FIG. 1 by the rectangle surrounding the individual components) that encapsulates the individual components, such as the power semiconductors 5, the transceiver module 7, detector 8, and the rectifier. Unlike illustrated in FIG. 1 DC link capacitor 2.2 usually is not arranged in the housing.

The controller 9 is arranged separate from this power semiconductor module 10, i.e., outside the housing, and may be connected to other circuits (not shown) which in turn can correspondingly signal and control the controller 9. The data link and thus the exchange of control signals between the transceiver module 7 and the controller 9 is not made via an electrical conductor but by electromagnetic radiation, resulting in a potential barrier between controller 9 and the power semiconductor module 10, and resulting in communication of data and heat between the module 10 and the controller 9 being decoupled. Communicating the data of the controller 9 to other parts can be done by using a bus 100.

Figure 2:
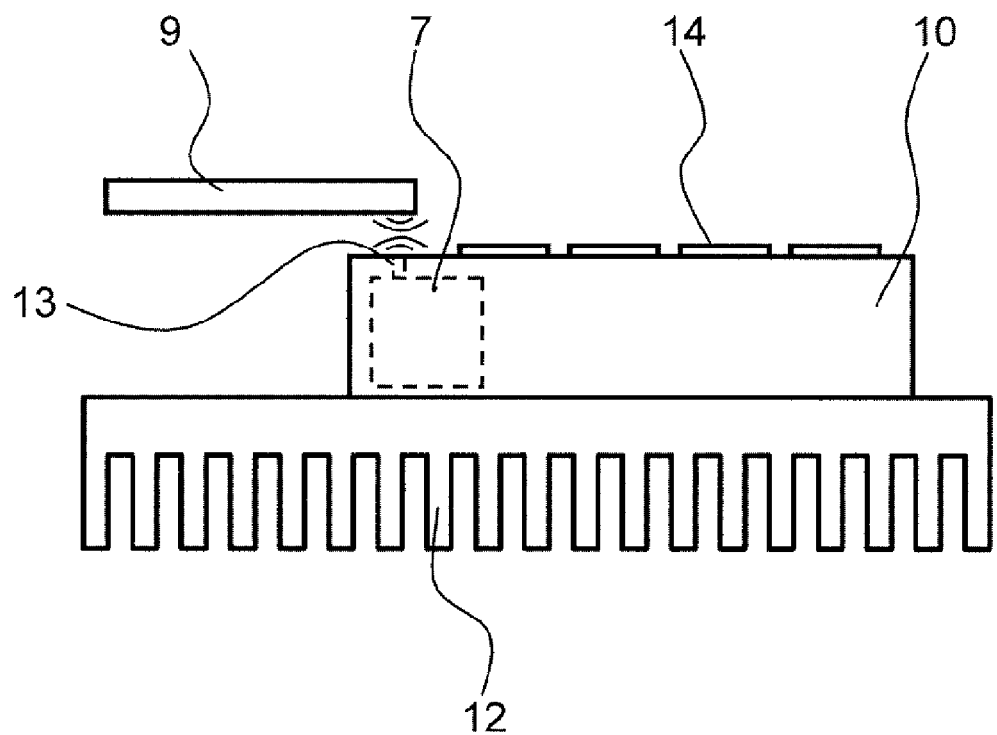
FIG. 2 is a side view of the structure of one such power electronics device.

FIG. 2 illustrates in a side view the physical (mechanical) structure of the power electronics device as shown in the block circuit diagram of FIG. 1. The power semiconductor module 10 includes the power semiconductors 5 including their freewheeling diodes, the drivers 6, the transceiver module 7 and the detector 8. Additionally the rectifier bridge 2.1 may be included in the power semiconductor module 10. The power semiconductor module 10 is mounted on a heat sink 12. The controller 9 may be arranged at a small distance away from the power semiconductor module 10 over a corner region of the power semiconductor module 10 at a side facing away from the heat sink 12.

The controller 9 communicates with the transceiver module 7 over a short wireless link forming the electromagnetic-based communication link. For this purpose the power semiconductor module 10 may feature a waveguide 13 with the aid of which the electromagnetic radiation is directed much less lossy than in "free" communication. For wireless communication a signal is modulated (by amplitude, frequency or phase modulation) on a carrier frequency in the corresponding transmitter of one of the transceiver modules 7 and 7' and is irradiated to be received by the receiver of the other one of the transceiver modules 7 and 7'. The receiver demodulates the received signal back into the communicated control signal. Using such signal transmission distances in the centimeter and decimeter range between the power semiconductor module 10 and the controller 9 can be bridged with good results, achieving added freedom of design. To satisfy electromagnetic compatibility (EMC) requirements an optional casing may house at least the complete wireless link, the housing may be adapted to achieve best possible shielding especially at the carrier frequency of the wireless link. Practically the whole surface of the side of the power semiconductor module 10 facing away from the heat sink 12 is available to accommodate load terminals 14.

Figure 3:
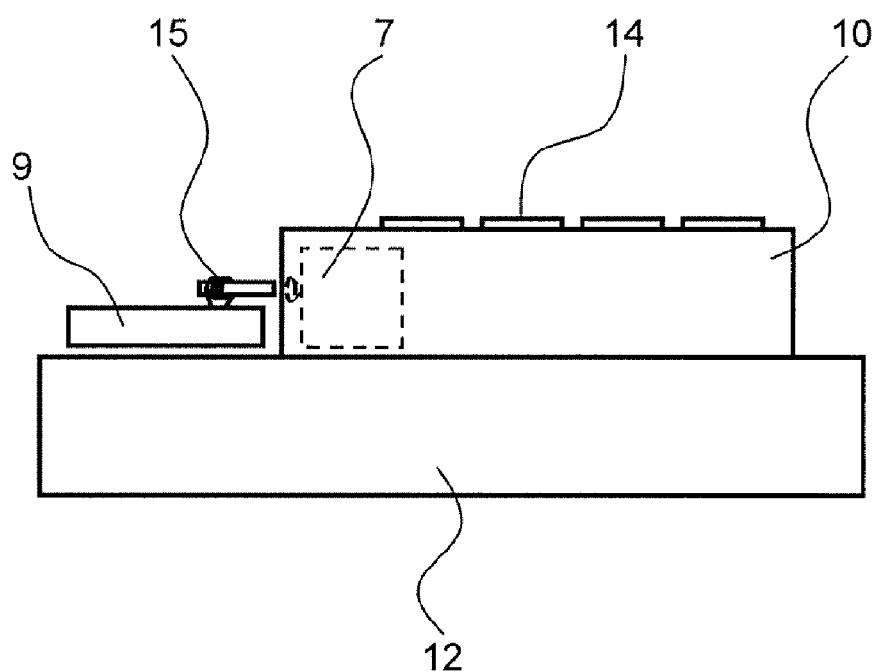
FIG. 3 is a side view of the structure of a power electronics device as a further example.

FIG. 3 illustrates in a side view a further power electronics device by way of example. In this device controller 9 is arranged on the heat sink 12 and the communication between the controller 9 and the transceiver module 7 is made via coupled inductors, for example an air-coupled transformer 15. At the controller 9 side the transformer 15 includes a ferromagnetic core in an inductor winding to communicate the magnetic field focussed to the inductor at the side of the transceiver module 7. In this arrangement the inductors may include just a few windings.

Figure 4:
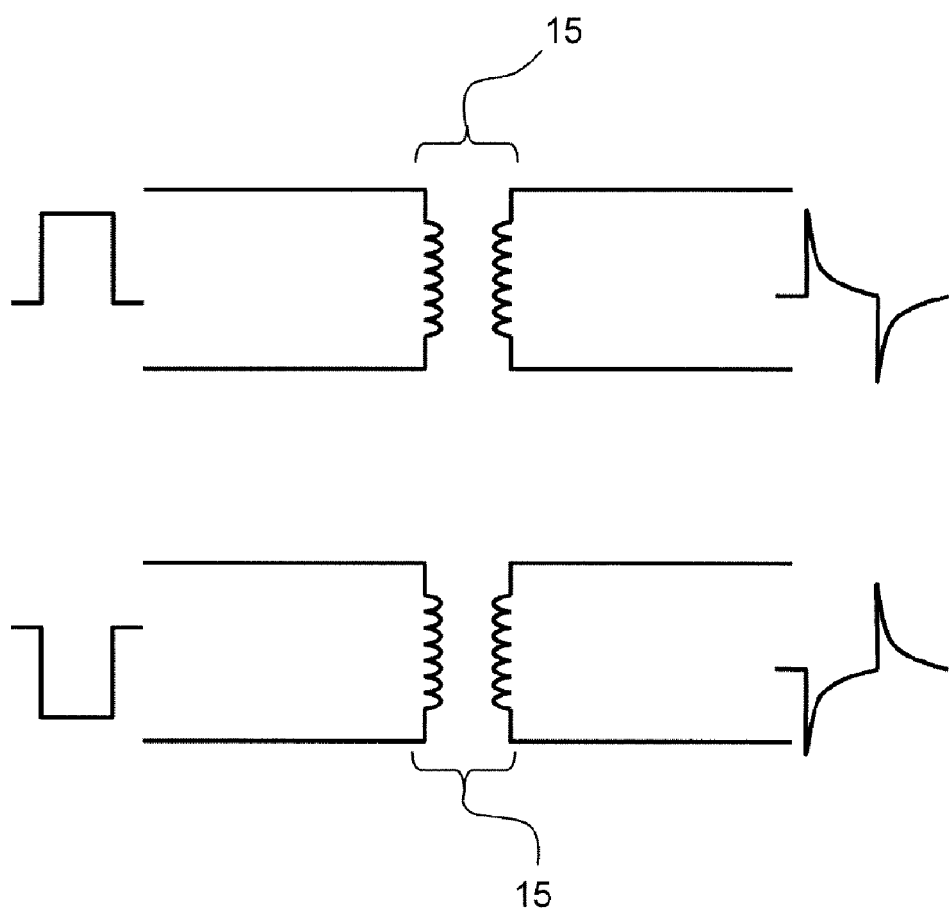
FIG. 4 illustrates a variant of how controller and power semiconductor module communicate by using square wave pulses in a power electronics device.
Figure 5:
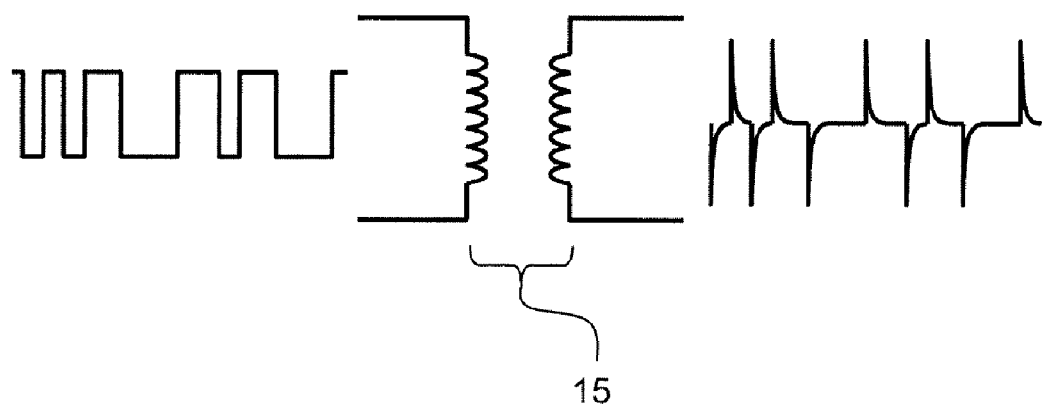
FIG. 5 illustrates another variant of how controller and power semiconductor module communicate.

FIGS. 4 and 5 illustrate signal communication between the controller 9 and the transceiver module 7 using coupled inductances, and using square wave voltage pulses applied at one side of the coupled inductances. At the time of rising or falling edges of the voltage pulses short voltage pulses occur at the other side of the coupled inductances, with the voltage decaying in accordance with an e function after the short pulses. These voltage pulses can be decoded in the corresponding receiver for the information contained therein whereby, in the simplest case, just the sign of the voltage pulse may be sufficient to signal ON or OFF. In this arrangement each and every power semiconductor can be assigned precisely one information channel, for example.

A higher reliability in protecting the device from external interference is achievable by using, for example, two communication links that are operated differentially, between which the signals have a predefined relationship to each other to be recognized as being "valid information" (FIG. 4), by using only one communication link in which the valid information is formed by certain sequence patterns predefined in time and involving a train of voltage pulses sequenced in time (FIG. 5).

Figure 6:
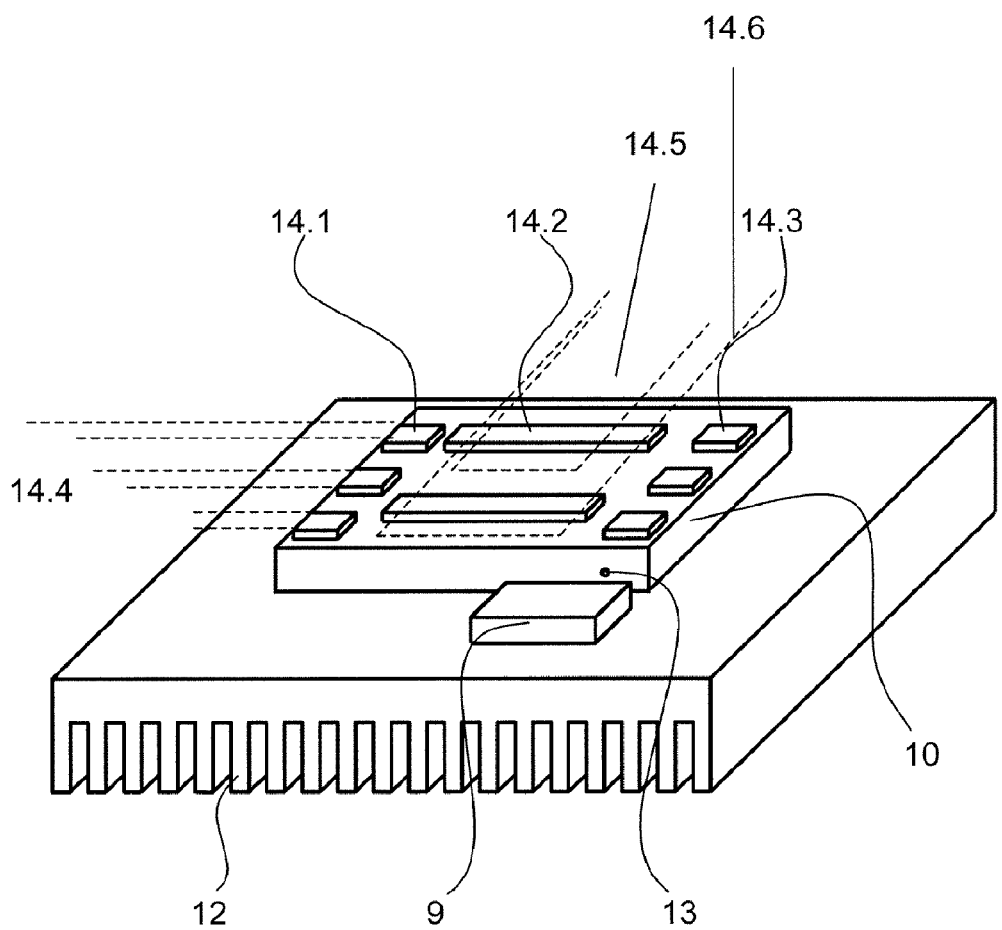
FIG. 6 is a view in perspective illustrating the structure of a third example of a power electronics device by way of example.
Figure 7:
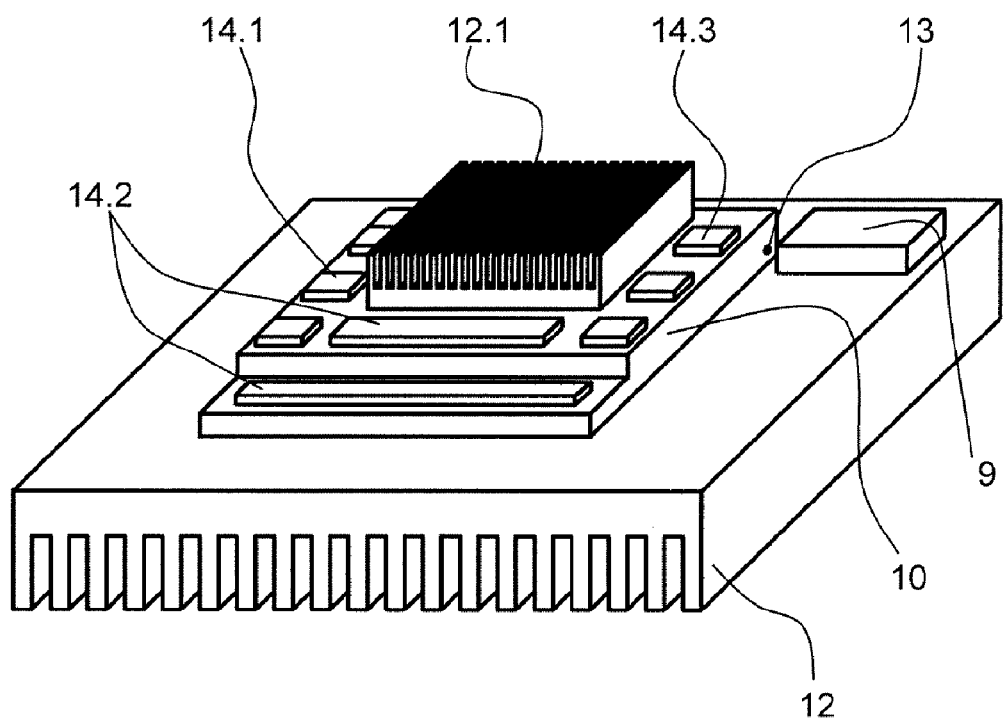
FIG. 7 is a view in perspective illustrating the structure of a fourth example of a power electronics device.

FIG. 6 and FIG. 7 illustrate how a wireless link is used for communication between the controller 9 and the controller contained in the power semiconductor module 10, this wireless link also running via an optional waveguide 13 guided in the power semiconductor module 10. In each case the controller 9 is sited alongside the power semiconductor module 10 on the heat sink 12, resulting in its deck surface providing ample room for the load terminals 14.1 from the line power supply, 14.2 to the smoothing capacitor and 14.3 to the output side. The resulting added freedom of design can be made use of to achieve modules combining a smaller footprint with a reduced input impedance and lower stray inductivity.

Because of its high capacitance and, consequently, its large footprint the smoothing capacitor 2.2 (see FIG. 1) is usually not integrated in the power semiconductor module 10. For this reason the power semiconductor module 10 including a rectifier and a converter has external load terminals 14.2 for connecting the smoothing capacitor 2.2. In the module 10 the load terminals are connected to the rectifier 2.1, as it has been illustrated with reference to FIG. 1. Terminals 14.2 that are connected to all power semiconductors inside the module 10 are configured as elongated pads to which strip conductors can be connected. This allows the terminals 14.2 to handle the very high current pulses between the capacitor 2.2 and the semiconductors 5 with no loss and where possible without any inductive obstruction.

FIG. 7 illustrates how one of the two DC terminals 14.2 is arranged at a lowered edge portion of the power semiconductor module 10. In addition to the large heat sink 12 which also serves as a mount, there is room for a further heat sink 12.1 on the surface of the power semiconductor module 10 that is opposite the heat sink 12.

The power electronics devices as described above thus form circuit assemblies including a power semiconductor module and a controller that is arranged external to the power semiconductor module. Accommodated in the power semiconductor module are the controllable power semiconductors and the drivers including their power supply as well as parts of the floating signal supply, resulting in the power semiconductor module having no control terminals brought as a DC decoupled connection. The controller is sited by at least a small distance away from the power semiconductor module. Control signals are communicated between the controller and the power semiconductor module by using an electromagnetic communication link, both parts, for this purpose, each including a transceiver and circuit parts for controlling these items and for decoding the signals received thereby. Circuited upstream of the drivers at the power semiconductor module side is a transceiver which decodes the signals sent by the controller and provides the commands received thereby to the corresponding drivers.

Besides the load terminals 14.1 for applying the input voltage, the terminals 14.2 for connecting the DC link capacitor 2.2 thereto, and the output terminals 14.3 power module 10 has no further external terminals. Referring to the discussion hereinabove a terminal for receiving control signals is not required, because these signals are transmitted wireless. A supply voltage for control circuitry inside the module, such as drivers 6 transceiver circuit 7, and detector 8, is generated from the input voltage or form the voltage across DC link capacitor 2.2 so that no additional supply terminals are required.

Because communication of the control signals from the controller to the power semiconductor module does not require a hardwired signal connection, but is achieved electromagnetically necessitating no material medium, signal management and heat management are effectively separated from each other. In addition to this, eliminating the control terminals gives additional room for arranging the load terminals, thereby making it possible to dimension and guide the load current conductors so that their ohmic and inductive resistance is very low.

Immunity to interference is achieved, for example, by using two communication channels for each pair of communicants, information being communicated in a predefined temporal context over both communication channels and only the signals received as accordingly possible being accepted as valid information. Immunity to interference can also be achieved by communicating over a single communication link, a sequence pattern of individual pulses being assigned to each possible item of information to be communicated so that only such sequence patterns are accepted as valid information at the receiver end.

A distance between the transceivers of the wireless link for communication may, for example, be in the range of 0.1 to 1 mm. This ensures, on the one hand, in the simplest way possible, good coupling for communicating the information with very low stray ambient radiation, whilst, on the other, this spacing greatly reducing heat transfer as compared to direct contact. The communication link can be, for example, in the HF domain to bridge even distances in the centimeter and decimeter range with no problem, optimizing the freedom in arranging the communication partners in one and the same device.

The power semiconductor module can be bonded to two opposite pads each featuring a heat sink. This architecture, that is particularly advantageous for placement of the heat sinks, is now possible due to room being made available by arranging the controller separately on the power semiconductor module.

FIGS. 6 and 7 illustrate how according to one example embodiment of the invention a power semiconductor module is configured multi-segmented, each segment containing a fraction of the power semiconductors, for example a half-bridge, including their drivers and a receiver module assigned thereto, a controller then including a separate communication link for each receiver module in an architecture which is particularly good scalable.

As evident from the example as shown in FIG. 6 and indicated dot-dashed therein this freedom in designing a power semiconductor module as achieved by these novel assemblies now makes it simple to contact even a special arrangement of contact pads 14.4 for connecting a supply or load bus whilst also making it possible to contact tracks 14.5 and 14.6 stacked and electrically separated from each other by air or by a solid insulator.

In addition to the assemblies as described a number of other assemblies is possible. It should be noted that it is now also possible to configure a power semiconductor module segmented, each segment including, for example, a half-bridge including its driver and a receiver module assigned thereto, resulting in a controller containing a communication link separate for each receiver module. In addition to this it may also be provided for that a sole controller controls a plurality of modules, each independent of the other via separate wireless connections in each case.

It is to be understood that the features of the various exemplary embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit assembly comprising:
    a power semiconductor module encapsulated in plastic comprising at least one controllable power semiconductor and at least one driver controlling the at least one power semiconductor and a power supply for the driver(s); and
    a controller arranged externally to the power semiconductor module;
    wherein the controller and the power semiconductor module each comprise a transceiver configured to communicate control signals between the controller and the at least one power semiconductor module via an electromagnetic communication link unidirectionally or bidirectionally; and
    wherein the power semiconductor module and the controller are both arranged on a heat sink being spaced away from each other.

2. The circuit assembly of claim 1, wherein the transceivers in the power semiconductor module and the controller each comprise an inductor and the communication link is configured by electromagnetically coupling the inductors.

3. The circuit assembly of claim 2, wherein the inductor at the side of the controller comprises a ferromagnetic core extending to the power semiconductor module.

4. The circuit assembly of claim 2 wherein the transceivers are adapted to apply square wave pulses to one of the inductors, and to decode voltage pulses produced in the corresponding other inductor by the square wave pulses.

5. The circuit assembly of claim 4 wherein voltage pulses generated in the transceiver of the power semiconductor module are supplied to the at least one driver.

6. The circuit assembly of claim 2 wherein:
    transceivers in the power semiconductor module and in the controller each comprise two inductors, and inductor in the transceiver and an inductor in the power semiconductor module forming a pair of inductors;
    the communication link is formed by the two pairs of intercoupled inductors; and
    a control signal is simultaneously communicated via the two pairs of inductors.

7. The circuit assembly of claim 6 wherein the transceivers are adapted to compare control signals received via both pairs of inductors to each other.

8. The circuit assembly of claim 1 wherein the electromagnetic communication link comprises an air link of 0.1 to 1 mm.

9. The circuit assembly of claim 2 wherein the transceiver at the transmitting side is adapted to assign a defined sequence pattern of individual pulses to the control signals, and the transceiver at the receiving side is adapted to use only control signals having this defined sequence pattern for control.

10. The circuit assembly of claim 1 wherein the power semiconductor module and the controller are arranged spaced away from each other at a heat sink.

11. The circuit assembly of claim 1 wherein the power semiconductor module includes a plastic housing.

12. The circuit assembly of claim 1 wherein the power semiconductor module is connected to two pads thereof facing each other, each provided with a heat sink.

13. A circuit assembly comprising:
    a power semiconductor module encapsulated in plastic comprising a controllable power semiconductor, a driver controlling the at least one power semiconductor, and a transceiver; and
    a controller arranged externally to the power semiconductor module and comprising a transceiver;
    wherein the controller and the power semiconductor module transceivers are configured to communicate control signals between the controller and the at least one power semiconductor module via an electromagnetic wireless communication link working in the high-frequency range; and
    wherein the power semiconductor module and the controller are both arranged on a heat sink being spaced away from each other.

14. The circuit assembly of claim 13, wherein the wireless link passes partly through portions of the power semiconductor module and/or of the controller which at the wireless frequency are best conductive electromagnetically.

15. The circuit assembly of claim 13, wherein the wireless link comprises a waveguide.

16. The circuit assembly of claim 13, wherein the wireless link comprises elements for focusing electromagnetic waves.

17. A circuit assembly comprising:
    a power semiconductor module encapsulated in plastic comprising a transceiver, the power semiconductor module being segmented such that each segment comprises a controllable power semiconductor and a corresponding driver; and
    a controller arranged externally to the power semiconductor module and comprising a transceiver;
    wherein the controller and the power semiconductor module transceivers are configured to communicate control signals between the controller and the power semiconductor module via an electromagnetic communication link unidirectionally or bidirectionally;
    wherein a separate communication link is disposed between the controller and each segment; and
    wherein the power semiconductor module and the controller are both arranged on a heat sink being spaced away from each other.

18. The circuit assembly of claim 17, wherein the transceivers in the power semiconductor module and the controller each comprise an inductor and the communication link is configured by electromagnetically coupling the inductors.

19. A method of controlling a circuit comprising:
    arranging a controller externally to at least one power semiconductor module encapsulated in plastic, wherein the at least one power semiconductor module comprises a controllable power semiconductor, a driver controlling the at least one power semiconductor, and a transceiver;
    communicating control signals between the controller and the at least one power semiconductor module, the controller comprising a transceiver;
    configuring the controller and the power semiconductor module transceivers to communicate via an electromagnetic wireless communication link working in the high-frequency range; and configuring the power semiconductor module and the controller such that they are both arranged on a heat sink and are spaced away from each other.

20. The method of claim 19 further comprising electromagnetically coupling inductors configured within the transceivers in the power semiconductor module and in the controller.

21. The method of claim 20 further comprising applying square wave pulses to one of the inductors, and decoding voltage pulses produced in the corresponding other inductor by the square wave pulses.

22. The circuit assembly of claim 21 further comprising supplying voltage pulses generated in the transceiver of the power semiconductor module to the driver.

* * * * *